United States Patent
Sell et al.

(10) Patent No.: US 6,600,680 B2
(45) Date of Patent: Jul. 29, 2003

(54) CIRCUIT CONFIGURATION AND METHOD FOR DETERMINING A TIME CONSTANT OF A STORAGE CAPACITOR OF A MEMORY CELL IN A SEMICONDUCTOR MEMORY

(75) Inventors: Bernhard Sell, Dresden (DE); Jürgen Lindolf, Friedberg (DE); Martin Popp, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/186,599

(22) Filed: Jul. 1, 2002

(65) Prior Publication Data

US 2003/0001185 A1 Jan. 2, 2003

(30) Foreign Application Priority Data

Jun. 29, 2001 (DE) ......................................... 101 31 675

(51) Int. Cl.[7] ................................................ G11C 7/00
(52) U.S. Cl. ..................... 365/189.9; 365/149; 365/194
(58) Field of Search ............................. 365/189.9, 149, 365/194

(56) References Cited

U.S. PATENT DOCUMENTS

| | | | | |
|---|---|---|---|---|
| 5,497,127 A | * | 3/1996 | Sauer | 331/17 |
| 5,808,936 A | * | 9/1998 | Nakayama | 365/185.18 |
| 6,061,289 A | * | 5/2000 | Itoh et al. | 365/226 |
| 6,178,108 B1 | * | 1/2001 | Miyatake et al. | 365/149 |

* cited by examiner

*Primary Examiner*—Richard Elms
*Assistant Examiner*—Tuan T. Nguyen
(74) *Attorney, Agent, or Firm*—Laurence A. Greenberg; Werner H. Stemer; Ralph E. Locher

(57) ABSTRACT

A ring oscillator has a multiplicity of inverters. An interconnect is connected between two of the inverters, and a storage capacitor to be measured, with its associated lead resistor, is coupled to the interconnect either via an interconnect or a transistor can selectively coupled and decouple the capacitor and the lead resistance. A measuring device is connected up to the ring oscillator and is used to determine a value for the oscillation frequency of the ring oscillator on the basis of which a value for the time constant of the storage capacitor can be determined.

10 Claims, 5 Drawing Sheets

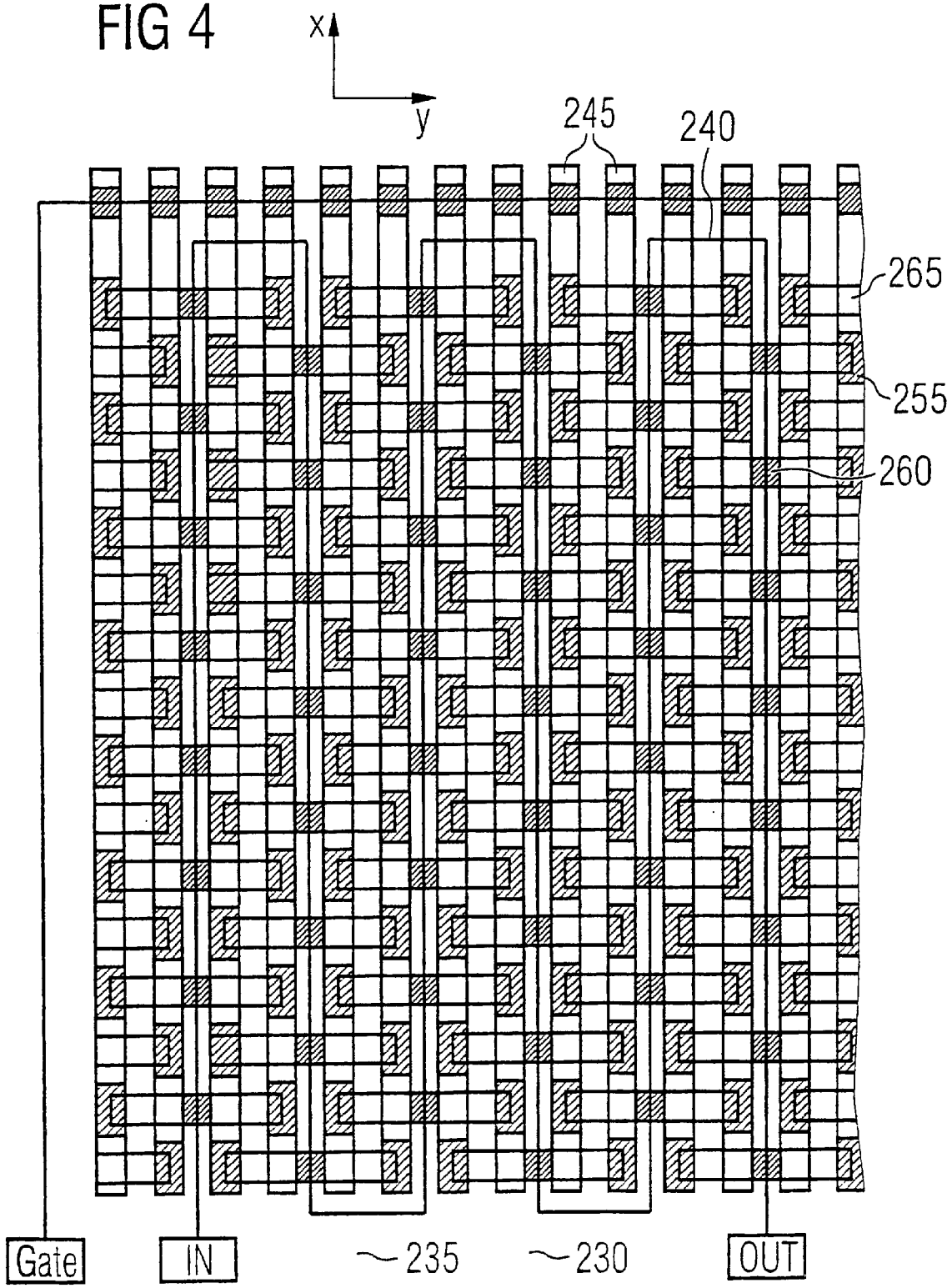

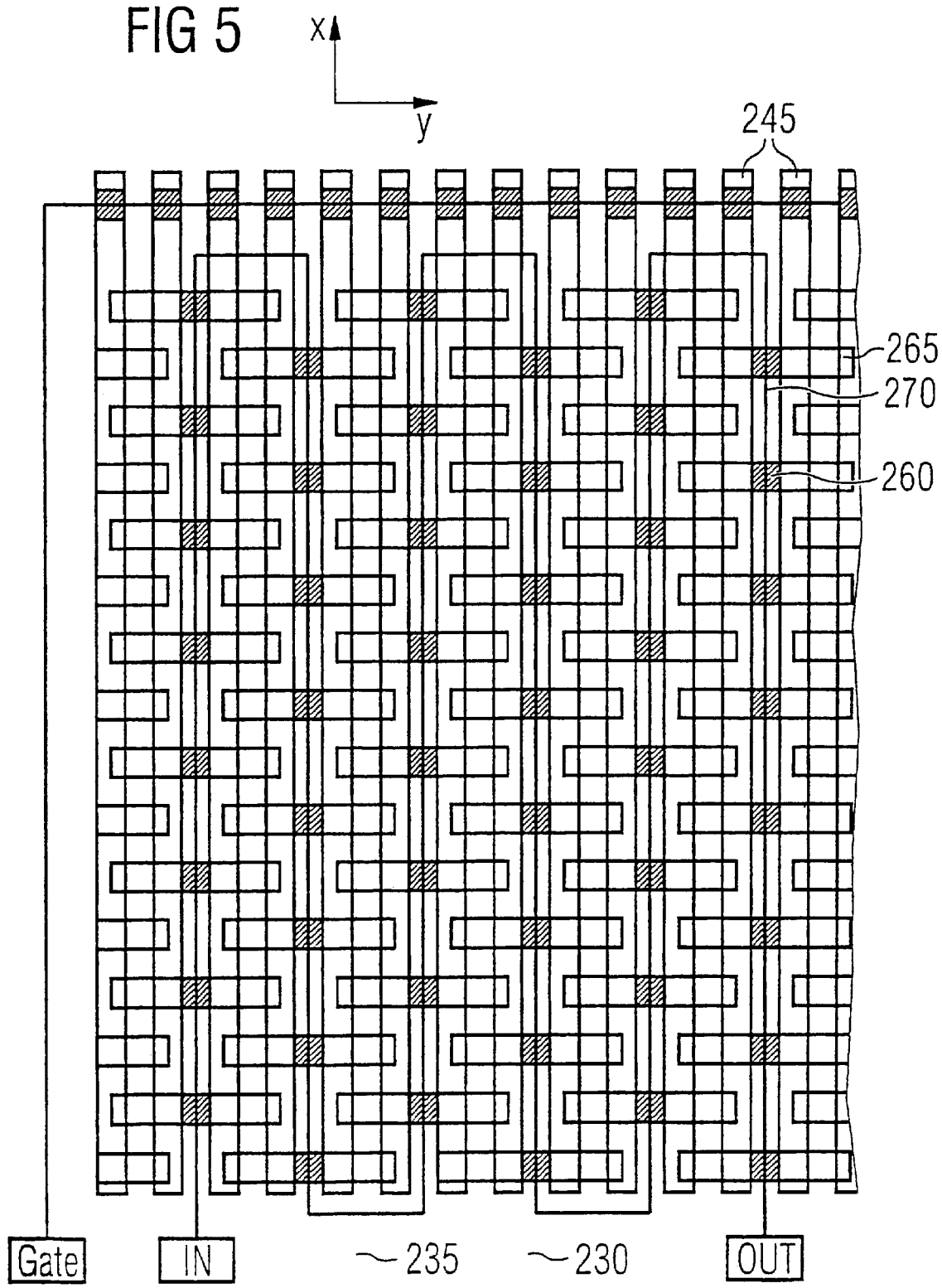

CIRCUIT CONFIGURATION AND METHOD FOR DETERMINING A TIME CONSTANT OF A STORAGE CAPACITOR OF A MEMORY CELL IN A SEMICONDUCTOR MEMORY

BACKGROUND OF THE INVENTION

Field of the Invention

The invention lies in the semiconductor technology and memory technology fields. More specifically, the invention relates to a circuit configuration and a method for determining a time constant of a storage capacitor of a memory cell of a semiconductor memory.

Semiconductor memories have memory cells each comprising, for example, a storage capacitor (or memory capacitor) and a selection transistor. The time duration for storing or for reading out an information item into the memory cell is determined, inter alia, by the time constant of the storage capacitor. The time constant thereby depends on the storage capacitance of the storage capacitor and the lead resistance of the storage capacitor. In this case, the storage capacitor may be regarded as a capacitor connected up to a resistor.

The time constant or the delay time during the signal transfer of a capacitor connected up to a resistor is referred to, by way of example, as RC time constant. Inter alia, RC time constants of a memory cell of a semiconductor memory, can be determined by means of the present invention. In order to determine for example the RC time constants of a memory cell which has a trench capacitor as storage capacitor of the memory cell, it is advantageous to configure the standard process for fabricating a DRAM as closely as possible to the fabrication process used in the product, so that the arrangement for determining the RC time constant, which arrangement is fabricated as a test structure, corresponds to a memory cell arranged in the product.

By way of example, if the RC time constant of a trench capacitor is to be determined, then the capacitance C is formed to the greatest possible extent by the capacitance of the trench capacitor. The resistance R comprises, inter alia, the resistance of the conductive trench filling of the trench capacitor and also the resistance of a buried contact formed in the trench and the resistance of a selection transistor which is connected to the trench capacitor and is switched into the on state.

In order to determine the delay time of a memory cell capacitor connected up to a resistor, it is known from the prior art, for example, that a trench capacitor which deviates greatly from the round form of a bored hole and assumes a slotted form in the substrate and thus has greatly modified geometrical forms compared with a trench capacitor used in the product in a memory cell can be used for determining a delay time. What is problematic here is that a structure which deviates very greatly from a storage capacitor used in the product is used for determining a delay time. Consequently, a product-relevant measurement of the RC time constant of the storage capacitor used in the product is not reliably possible with this structure.

SUMMARY OF THE INVENTION

It is accordingly an object of the invention to provide a circuit configuration and method for determining a time constant of a storage capacitor of a memory cell of a semiconductor memory, which overcomes the above-mentioned disadvantages of the heretofore-known devices and methods of this general type and which is useful to determine the time constant of the storage capacitor.

With the foregoing and other objects in view there is provided, in accordance with the invention, a circuit configuration for determining a time constant of a storage capacitor of a memory cell of a semiconductor memory, comprising:

a ring oscillator, which has at least three series-connected inverters;

an interconnect, which has a first segment and a second segment and which connects up two inverters of the ring oscillator to one another;

a storage capacitor and a lead resistor, which has a first resistor terminal and a second resistor terminal, the first resistor terminal being connected to the storage capacitor and the second resistor terminal being connected to the interconnect between the first segment and the second segment;

a measuring device, which is connected up to the ring oscillator and which can be used to determine a value for the oscillation frequency of the ring oscillator, a device by which a value for the time constant of the storage capacitor can be determined on the basis of the value of the oscillation frequency.

The storage capacitor is connected via the lead resistor to the interconnect which is arranged between two inverters of the ring oscillator. This increases the total capacitance of the interconnect, as a result of which the oscillation frequency of the ring oscillator is reduced. The time constant of the storage capacitor and the lead resistor can be determined from the reduction of the oscillator frequency.

In accordance with an added feature of the invention, the measuring device comprises a frequency divider. A frequency divider has the advantage that it divides a possibly very high oscillation frequency of the ring oscillator down to a significantly lower frequency which, in a downstream circuit, on account of the lower frequency, can be determined in a simplified manner with a significantly lower outlay on apparatus.

In accordance with an additional feature of the invention, the circuit configuration further has a second ring oscillator comprising at least three series-connected inverters to be arranged as reference resonant circuit, and a mixer having a first mixer input, a second mixer input and a mixer output to be connected up to the ring oscillator and the second ring oscillator, the first ring oscillator being connected to the first mixer input and the second ring oscillator being connected to the second mixer input and the mixer output being connected to the measuring device for the purpose of determining a value for the difference between a first frequency of the first ring oscillator and a second frequency of the second ring oscillator.

The mixer makes it possible to generate a signal which characterizes the difference between the frequency of the first ring oscillator and the second ring oscillator. This enables the direct determination of a differential frequency. The second ring oscillator is used as reference resonant circuit, so that it does not comprise, for example, the storage capacitors to be measured, the latter only being coupled to the interconnect in the case of the first ring oscillator.

A further refinement of the circuit configuration according to the invention provides for a transistor to be connected up in such a way that the lead resistor and the storage capacitor can be coupled to and decoupled from the interconnect by means of the transistor. The transistor enables the targeted connection of the storage capacitor to be measured, including the lead resistor. The conductivity and thus the electrical resistance of the controllable path of the transistor can be controlled via a gate terminal. If the controllable path is set such that it has a high resistance, then the storage capacitor is practically decoupled from the interconnect. By contrast, if the controllable path is set at very low impedance, then the storage capacitor is coupled to the interconnect and has an attenuating effect on the oscillation frequency of the ring oscillator.

In accordance with another feature of the invention, a multiplicity of storage capacitors of memory cells of a memory cell array of a semiconductor memory are connected up to the interconnect. This is advantageous since the storage capacitance of a storage capacitor of a semiconductor memory is usually made very small, so that the parallel coupling of a multiplicity of storage capacitors to the interconnect effects a frequency alteration of the oscillation frequency of the ring oscillator which is greater by a multiple. The frequency change of the ring oscillation which is enlarged by a multiple can be measured with lower measurement outlay, with reduced susceptibility to interference and increased precision.

A further advantageous refinement of the circuit configuration according to the invention provides for the circuit configuration to be arranged on a substrate, on which a word line for controlling the transistor and the interconnect are arranged, the word line running parallel to the interconnect at least in sections. By virtue of this routing of the interconnect to which the multiplicity of capacitors connected up to resistors is in each case connected, the time-delaying effect of the multiplicity of storage capacitors is combined with one another for influencing the oscillation frequency of a ring oscillator. By virtue of the special routing of the interconnect, a meandering structure is arranged on the substrate.

With the above and other objects in view there is also provided, in accordance with the invention, a method for determining a time constant of a storage capacitor of a memory cell of a semiconductor memory. The method has the following steps:

providing a circuit configuration which comprises a ring oscillator having at least three series-connected inverters,
which comprises an interconnect having a first segment and a second segment, the interconnect connecting up two inverters of the ring oscillator to one another,
which comprises a storage capacitor and a lead resistor, the lead resistor connecting the storage capacitor to the interconnect between the first segment and the second segment, and
which comprises a measuring device, which is connected up to the ring oscillator;
determining a value for the oscillation frequency of the ring oscillator by means of the measuring device, a value for the time constant of the storage capacitor being determined from the value for the oscillation frequency.

The method according to the invention makes it possible to determine the time constant of the storage capacitor.

A further, advantageous method step provides for
the lead resistor and the storage capacitor to be connected up to the interconnect by means of a transistor and to be able to be coupled to and decoupled from the interconnect by means of the transistor,
a first value for a first oscillation frequency of the ring oscillator being determined for the operation of the ring oscillator decoupled from the interconnect by means of the transistor, and
a second value for a second oscillation frequency of the ring oscillator being determined for the operation of the ring oscillator coupled to the interconnect by means of the transistor, and
the time constant of the storage capacitor to be determined on the basis of the first value and the second value.

A further refinement of the method according to the invention provides for
a second ring oscillator, which comprises at least three series-connected inverters to be provided as reference resonant circuit,
a mixer having a first mixer input and a second mixer input and a mixer output to be provided, the first ring oscillator being connected up to the first mixer input and the second ring oscillator being connected up to the second mixer input, and
the mixer to form a value for the difference between the first oscillation frequency of the first ring oscillation and the second oscillation frequency of the second ring oscillator and to communicate it to the measuring device, and
the time constant of the storage capacitor to be determined on the basis of the value for the difference between the frequencies.

Other features which are considered as characteristic for the invention are set forth in the appended claims.

Although the invention is illustrated and described herein as embodied in a circuit configuration and a method for determining a time constant of a storage capacitor of a memory cell of a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a further plan view of a substrate surface, wherein the elements to be measured can be coupled to the interconnect by way of transistors; and FIG. 5 is a diagrammatic view of a configuration of a delay path as can be used in the reference resonant circuit, so that it is possible to determine a difference between a delay path with trench capacitors and a delay path without trench capacitors.

DESCRIPTION OF THE PREFERRED EMBODIMENTS

Figure 1:
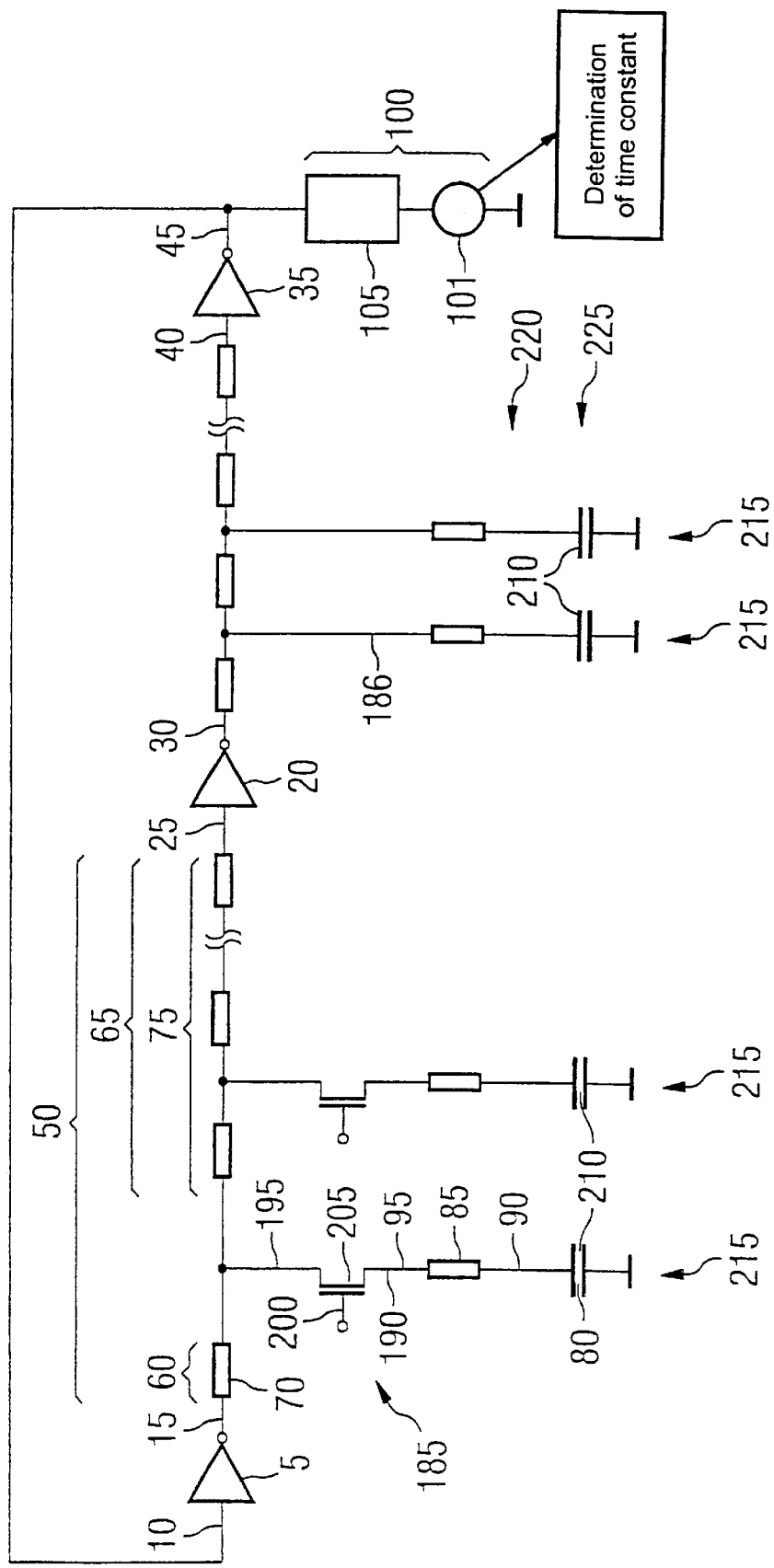
FIG. 1 is a circuit schematic of a first ring oscillator, which can be used for determining the signal delay time of a storage capacitor.

Referring now to the figures of the drawing in detail and first, particularly, to FIG. 1 thereof, there is shown a first inverter 5 having a first input 10 and a first output 15. The illustration furthermore shows a second inverter 20 with a second input 25 and a second output 30. A third inverter 35 has a third input 40 and a third output 45. The first output 15 is connected to the second input 25 through an interconnect 50 or conductor track 50, the second output 30 is connected to the third input 40, and the third output 45 is connected to the first input 10. This ring configuration thus forms a ring oscillator 55.

A ring oscillator usually comprises an odd number of inverters which are connected in series, the output of the last inverter being connected up to the input of the first inverter. By virtue of the odd number of inverters, for the ring oscillator circuit there is only an indifferently stable and no stable state, which reverts to a stable quiescent position upon deflection, so that the circuit oscillates.

The interconnect 50 has a first segment 60 and a second segment 65. The first segment 60 is wherein for example by a first electrical resistance 70. The second segment 65 is wherein by a second electrical resistance 75. A capacitor 80 is connected to the interconnect 50 by way of a lead resistor 85. In this case, the lead resistor 85 has a first resistor terminal 90 and a second resistor terminal 95. The first resistor terminal 90 is connected to the capacitor 80, and the second resistor terminal 95 is connected to the interconnect 50 between the first segment 60 and the second segment 65.

A measuring device 100 is connected to the third output 45. The measuring device comprises, for example, a frequency divider 105 which is suitable for dividing down the oscillation frequency of the ring oscillator, so that the frequency can be determined with a lower outlay. Furthermore, the measuring device 100 comprises functions for determining the oscillation frequency of the ring oscillator 55.

A transistor 185 is additionally arranged, which has a first transistor terminal 190, a second transistor terminal 195 and a gate terminal 200. The transistor 185 additionally has a controllable path 205, between the first transistor terminal 190 and the second transistor terminal 195, that can be controlled via the gate terminal 200. The first transistor terminal 190 is connected to the second resistor terminal 95, and the second transistor terminal 195 is connected to the interconnect 50 at a location between the first segment 60 and the second segment 65. As a result of this, the object to be measured, comprising the capacitor 80 and the lead resistor 85, is connected to the interconnect 50 by way of the transistor 185.

The transistor can be put into high-impedance state and a low-impedance state by a suitable gate voltage, which is applied to the gate terminal 200. In addition, by way of example, between the second inverter 20 and the third inverter 35, a capacitor with a lead resistor is connected via a conductive connection 186 to the conductive connection between the second inverter 20 and the third inverter 35. As an alternative, this connection can also be formed as a controllable transistor.

A method for determining the signal delay time of the capacitor 80 connected up to the resistor 85 provides for the oscillation frequency of the ring oscillator to be determined by way of the measuring device 100. The signal delay time of the resistor 85 and the capacitor 80 can subsequently be determined from the oscillation frequency.

One method variant provides for the lead resistor 85 and the capacitor 80 to be decoupled from the interconnect 50 by means of the transistor 185, by the transistor 185 being put into a high-impedance switching state. A reference frequency of the ring oscillator 55 is determined in this switching state. Afterward, the transistor 185 is put into a low-impedance state, so that the resistor 85 and the capacitor 80 are coupled to the interconnect 50. Then, by means of a further frequency measurement, the oscillation frequency is determined for determining the signal delay time of the capacitor 80 and the lead resistor 85.

By way of example, the signal delay time additionally caused by the resistor and the capacitor can be determined from the difference between the reference frequency and the oscillation frequency.

Furthermore, the illustration shows a multiplicity of storage capacitors 210 and a multiplicity of memory cells 215 of a memory cell array 220 of a memory 225. These can likewise be coupled to the interconnect 50 by means of a conductive connection or by means of transistors.

Figure 2:
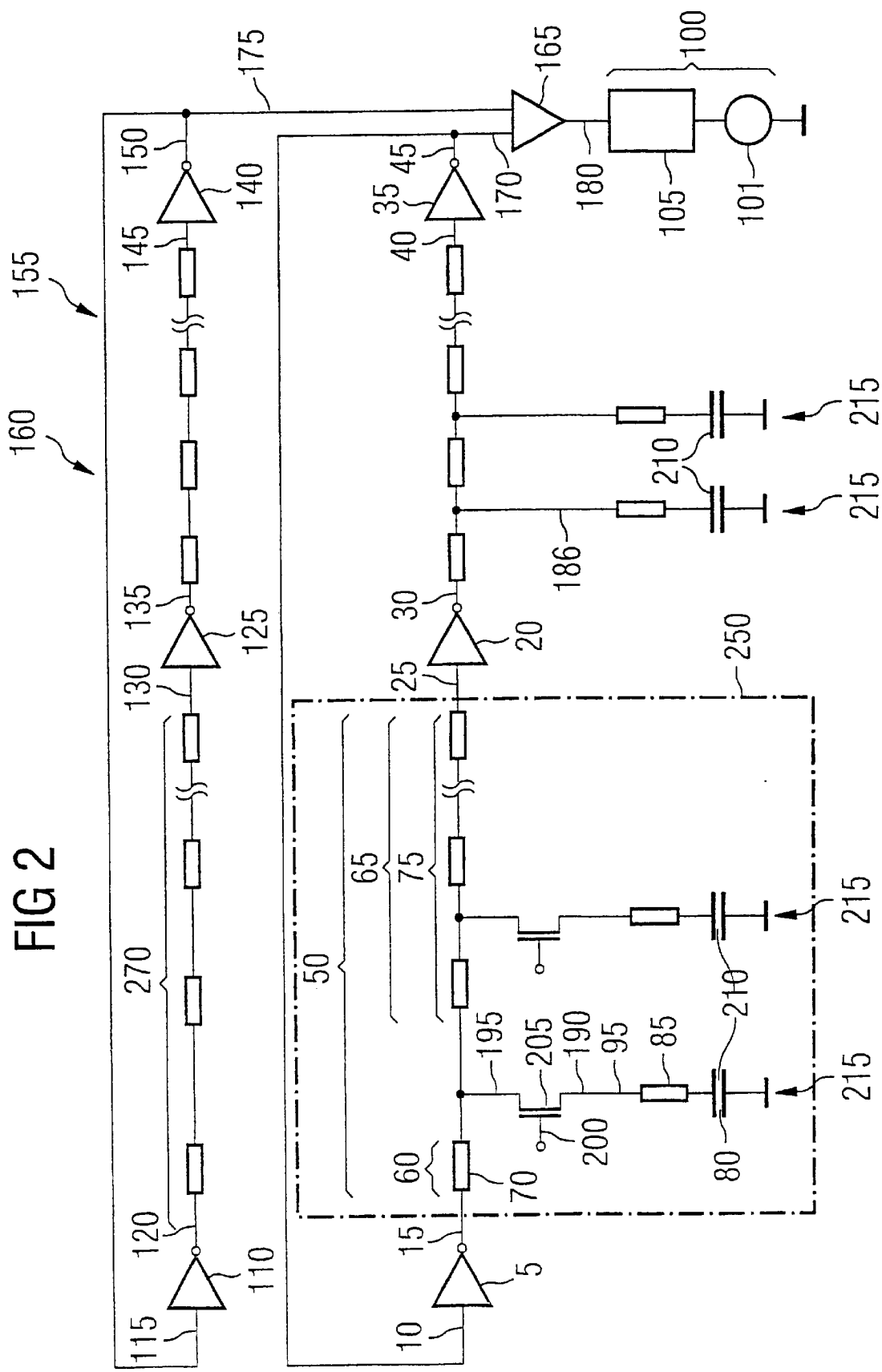
FIG. 2 is a circuit schematic of a first ring oscillator, which has the storage capacitor to be measured, and a second ring oscillator, which can be used as a reference ring oscillator.

Referring now to FIG. 2, there is illustrated the ring oscillator 55 from FIG. 1 and, in addition, a ring oscillator 155. The latter includes a fourth inverter 110 with a fourth input 115 and a fourth output 120 and also a fifth inverter 125 with a fifth input 130 and a fifth output 135 and a sixth inverter 140 with a sixth input 145 and a sixth output 150. The fourth output 120 is connected to the fifth input 130, the fifth output 135 is connected to the sixth input 145 and the sixth output 150 is connected to the fourth input 115. As a result of this, the second ring oscillator 155 is formed as reference ring oscillator 160.

A mixer 165 having a first mixer input 170, a second mixer input 175 and a mixer output 180 is connected to the two ring oscillators. The first mixer input 170 is connected to the first ring oscillator 55, and the second mixer input 175 is connected to the second ring oscillator 155. The mixer output 180 is connected to the measuring device 100, which comprises, for example, a frequency divider 105 and a circuit configuration 101 for determining a frequency which makes it possible to determine the signal delay time of the resistor 85 and the capacitor 80.

A method for determining a signal delay time of the capacitor 80 and the resistor 85 provides for the oscillator frequency of the reference ring oscillator 106 and the oscillation frequency of the ring oscillator 55, to which the resistance 85 to be measured and the capacitance 80 to be measured are connected, to be fed to the mixer, which compares these with one another and generates a differential frequency from which the signal delay time of the resistor and of the capacitor can be determined.

In FIG. 2, the circuit configuration 250 is connected between the first inverter 5 and the second inverter 20. The circuit configuration 250 will be explained in more detail with reference to FIGS. 3 and 4. The further interconnect 270 will be described in more detail in connection with FIG. 5.

Figure 3:
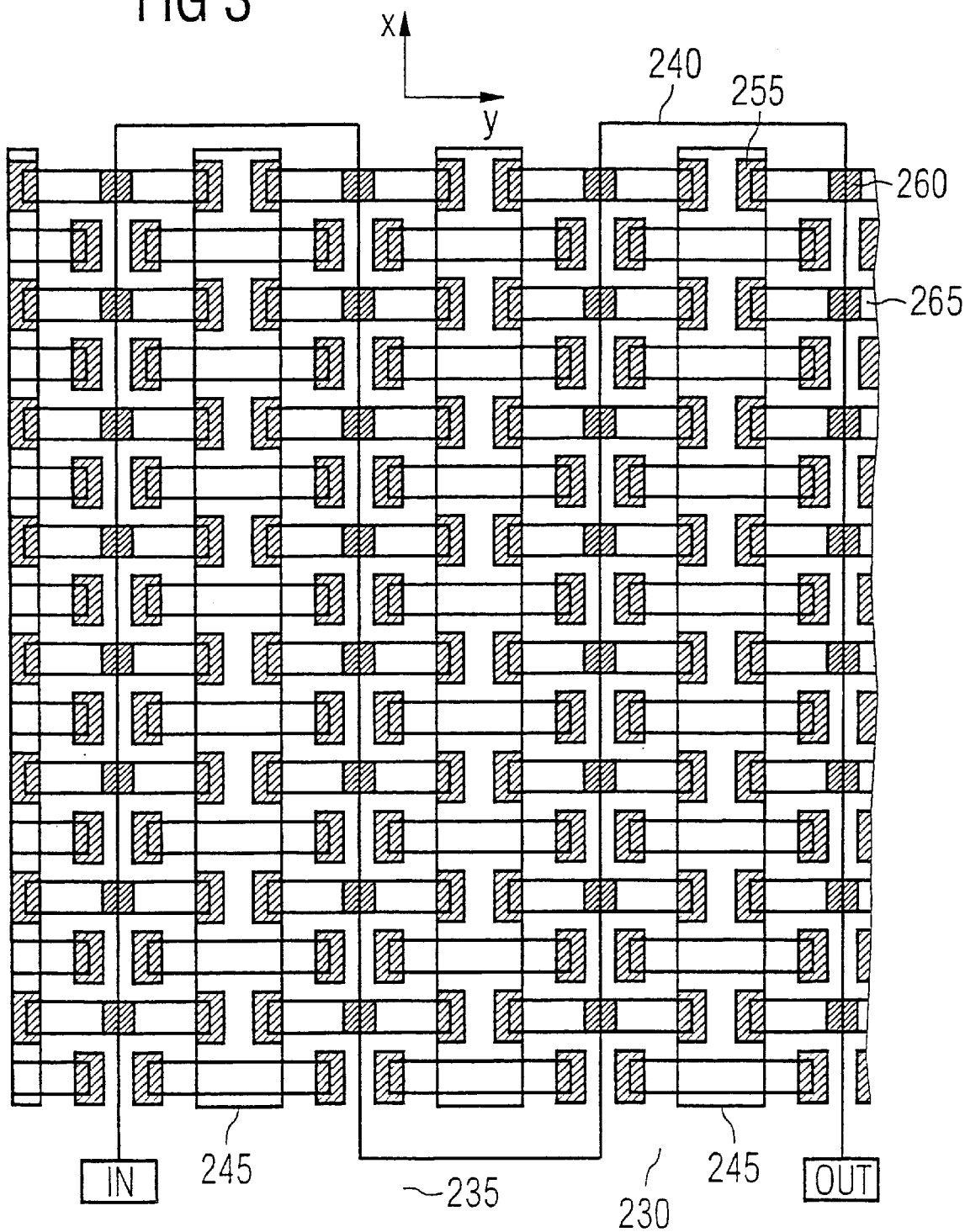
FIG. 3 is a plan view of a memory cell array of a semiconductor memory with trench capacitors, active regions, word lines, and an interconnect to which adjacent trench capacitors are connected.

FIG. 3 illustrates the interconnect 50 arranged between the first inverter 5 and the second inverter 20. The interconnect 50 is arranged on a substrate surface 235 of a substrate 230. The substrate surface 235 defines a first direction X and a second direction Y. The X and Y directions are mutually orthogonal. The interconnect 50 runs over an active region 265, to which a trench capacitor 255 is connected. Contrary to a customary layer for a DRAM memory cell array, in this exemplary embodiment the word line 245 is not arranged between the bit line contact 260 and the trench capacitor 255, but rather runs above the trench capacitor 255 and is insulated from the trench capacitor 255 by a suitable insulation layer. Consequently, during a subsequent implantation, a continuously doped region which connects the trench capacitor directly to the interconnect 50 is formed, rather than a transistor, between the trench capacitor 255 and the bit line contact 260. With respect to the first direction X, adjacent trench capacitors at adjacent active regions are connected to the interconnect 50. The interconnect 50 has a connecting element running in the direction of the second direction Y. Parallel to the first direction X, in a direction opposite to the first direction X, the interconnect 50 runs anew over active regions and thus contact-connects further trench capacitors 255 to the interconnect 50. The resistor 85, via which the trench capacitor 255 is connected to the interconnect 50, is formed for example by a conductive trench filling—arranged in the trench capacitor—and the continuously doped region in the active region 265.

A further exemplary embodiment provides for stacked capacitors rather than trench capacitors to be arranged at the position 255.

By way of example, the circuit configuration illustrated in FIG. 3 is connected between the second inverter 20 an the third inverter 35, the doped region between the trench capacitor 255 and the bit line contact 260 forming the conductive connection 186.

FIG. 4 illustrates the plan view of a memory cell array. An active region 265 is connected to a trench capacitor 255. The active region 265 is additionally connected to the interconnect 50 through a bit line contact 260. In contrast to FIG. 3, the word line 245 is arranged between the bit line contact 260 and the trench capacitor 255. The word line 245 is suitable for driving the gate terminal 200 of the transistor 185. Consequently, the trench capacitor 255 can be electrically coupled to and decoupled from the interconnect 50 by means of the word line 245. As in FIG. 3, the interconnect 50 likewise runs in a meandering fashion on the surface 235 of the substrate 230, wherein case, with respect to the first direction X, adjacent active regions 265 are connected to the interconnect 50 and the interconnect 50 has a connecting element 240 along the second direction Y, which element connects to one another a further segment of the interconnect 50 which runs antiparallel to the first direction X and likewise contact-connects adjacent active regions 265.

The circuit configuration illustrated in FIG. 4 is illustrated for example as the further circuit configuration 250 in FIG. 2.

FIG. 5 illustrates a further configuration of a memory cell array. In contrast to FIG. 4, however, no capacitors are formed, so that the interconnect 270 illustrated in FIG. 5 can be arranged for example as interconnect between the fourth inverter 110 and the fifth inverter 120 in order to influence the oscillation frequency of the reference ring oscillator 160.

If the lead resistor has a small resistance, then the capacitor 80 is coupled very well to the interconnect 50, so that it leads to a long signal propagation time and great attenuation which effects a large frequency alteration in the ring oscillator. If the lead resistor has the resistance 0, for example, then the resistance of the first segment 60 forms, together with the capacitor 80, a traditional low-pass filter. If the lead resistor has a resistance that differs from 0, then the capacitor 80, with rising resistance of the lead resistor, is coupled to the interconnect 50 to an ever lesser extent.

For a fast DRAM chip, wherein the charge stored in a storage capacitor 80 is to be transported as rapidly as possible to a sense amplifier, a large value for the lead resistor 85 has a braking effect on the charge transport from the capacitor 80 to a sense amplifier.

The present application describes test structures which contain a ring oscillator in order to generate on a memory chip an oscillating signal which can oscillate for example at a frequency of 200 MHz. The ring oscillator comprises a series of cascaded CMOS inverters. The inverters and the measuring device 100 may be arranged, for example, in the so-called kerf of the chip.

In order to enable an oscillation, an odd number of CMOS inverters are required in a ring oscillator circuit. An RC delay element to be measured can be integrated as connecting element between the individual inverters. The alteration of the signal propagation time caused by the RC delay element influences the frequency of the ring oscillator. The oscillation frequency of the ring oscillator is usually reduced by the connection of a capacitance to the connecting line between two inverters. At frequencies in the range of a few megahertz the oscillation signal can be measured directly by measurement tips at a characterization measurement station. For higher frequencies, a frequency divider may optionally be provided which reduces the frequencies that occur to a measurable level.

An increase in the measurement accuracy can furthermore be achieved by the arrangement of two ring oscillators, the RC element to be measured being integrated in the case of the first ring oscillator and the second ring oscillator not having the RC element to be measured and thus being usable as reference ring oscillator. The two oscillation signals can be combined with the aid of a mixer so that the mixer outputs, at its output, the difference between the two oscillations as differential frequency. Consequently, an output signal can be measured in the case of very small frequency differences between the ring oscillator and the reference ring oscillator. It can thus be expected that frequency differences between the ring oscillator and the reference ring oscillator in the thousandths range can be detected. For the example of a trench capacitor as RC element, the series resistance of the capacitor electrode can also be measured from these measurements, provided that the capacitance is determined by an independent measurement. This is possible for example by means of a static capacitance measurement.

By virtue of the coupling of the trench capacitors by means of a doping region or by means of a transistor, the parasitic quantities of the lead resistances and capacitances—such as metal tracks and contact hole fillings—can be eliminated in the measurement. To that end, the signal propagation path to be measured is firstly embodied with selection transistors and trench capacitors which are not arranged in the reference ring oscillator. By virtue of the parallel driving of the selection transistors, the capacitors are either connected or not connected for the delay paths. A conductive connection exists, for example, in the case of the reference ring oscillator. The influence of all the parasitic quantities on the measurement result can thus be eliminated.

This enables the time constant of an RC element to be measured directly. For this purpose, a ring oscillator, in particular, is used to generate an oscillation signal on the chip which can be converted into easily measurable quantities by the use of frequency dividers. In addition, the measurement accuracy can be considerably increased by the use of a reference ring oscillator and by mixing the measurement signal with the reference signal. In this case, the structures shown can be produced by means of a standard CMOS process.

One variant of the invention provides that the elements to be measured can be connected to the conductive connection 50 of a ring oscillator by means of a transistor. In this case, it is possible to integrate a large number of RC elements which effect a correspondingly large delay signal for the ring oscillator.

We claim:

1. A circuit configuration for determining a time constant of a storage capacitor of a memory cell of a semiconductor memory, comprising:
   a ring oscillator formed with at least three series-connected inverters;
   an interconnect having a first segment and a second segment and connecting two of said inverters of said ring oscillator to one another;
   a storage capacitor;
   a lead resistor having a first resistor terminal connected to said storage capacitor and a second resistor terminal connected to said interconnect between said first segment and said second segment;
   a measuring device connected to said ring oscillator for determining a value for an oscillation frequency of said ring oscillator, the value of the oscillation frequency providing information for a value for the time constant of the storage capacitor.

2. The circuit configuration according to claim 1, which further comprises a device connected to said measuring device for determining the value for the time constant of the storage capacitor based on the value of the oscillation frequency.

3. The circuit configuration according to claim 1, wherein said measuring device comprises a frequency divider.

4. The circuit configuration according to claim 1, wherein said ring oscillator is a first ring oscillator, and the circuit configuration further comprises:
   a second ring oscillator having at least three series-connected inverters forming a reference resonant circuit; and
   a mixer having a first mixer input connected to said first ring oscillator, a second mixer input connected to said second ring oscillator, and a mixer output connected to said measuring device for determining a value for a difference between a first frequency of said first ring oscillator and a second frequency of said second ring oscillator.

5. The circuit configuration according to claim 1, which comprises a transistor connected such that said lead resistor and said storage capacitor can be selectively coupled to and decoupled from said interconnect.

6. The circuit configuration according to claim 1, wherein a multiplicity of storage capacitors of memory cells of a memory cell array of a semiconductor memory are coupled to said interconnect.

7. The circuit configuration according to claim 5, wherein said circuit configuration is formed on a substrate having a word line for controlling said transistor, and said interconnect and said word line extend parallel to one another, at least in sections.

8. A method for determining a time constant of a storage capacitor of a memory cell in a semiconductor memory, which comprises the following method steps:
   providing a circuit configuration having a ring oscillator with at least three series-connected inverters, the circuit configuration further having:
      an interconnect with a first segment and a second segment, the interconnect connecting two inverters of the ring oscillator to one another;
      a storage capacitor and a lead resistor, the lead resistor connecting the storage capacitor to the interconnect between the first segment and the second segment;
   measuring, with a measuring device connected to the ring oscillator, an oscillation frequency of the ring oscillator; and
   determining from the oscillation frequency of the ring oscillator a value for the time constant of the storage capacitor.

9. The method according to claim 8, wherein the lead resistor and the storage capacitor are connected up to the interconnect via a transistor, whereby the lead resistor and the storage capacitor can be coupled to and decoupled from the interconnect by the transistor; and wherein the method further comprises:
   decoupling the lead resistor and the storage capacitor from the interconnect and determining a first value for a first oscillation frequency of the ring oscillator for an operation of the ring oscillator with the lead resistor and the storage capacitor decoupled from the interconnect;
   coupling the lead resistor and the storage capacitor to the interconnect and determining a second value for a second oscillation frequency of the ring oscillator for an operation of the ring oscillator with the lead resistor and the storage capacitor coupled to the interconnect; and
   determining the time constant of the storage capacitor on a basis of the first value and the second value.

10. The method according to claim 8, wherein the circuit configuration comprises a second ring oscillator with at least three series-connected inverters forming a reference resonant circuit, a mixer with a first mixer input connected to the first ring oscillator, a second mixer input connected to the second ring oscillator; and which further comprises:
   forming a value for a difference between the first oscillation frequency of the first ring oscillator and the second oscillation frequency of the second ring oscillator with the mixer and outputting the difference to the measuring device; and
   determining the time constant of the storage capacitor on the basis of the value for the difference between the first and second oscillation frequencies.

* * * * *